(12) United States Patent
Nedachi

(10) Patent No.: US 7,791,382 B2
(45) Date of Patent: Sep. 7, 2010

(54) SEMICONDUCTOR INTEGRATED CIRCUIT

(75) Inventor: Takaaki Nedachi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/414,977

(22) Filed: Mar. 31, 2009

(65) Prior Publication Data
US 2009/0251186 A1  Oct. 8, 2009

(30) Foreign Application Priority Data
Apr. 3, 2008  (JP) .............................. 2008-097156

(51) Int. Cl.
*H03L 7/00* (2006.01)
(52) U.S. Cl. .................. 327/141; 327/144; 327/291; 327/293; 327/231; 327/236
(58) Field of Classification Search .................. None
See application file for complete search history.

(56) References Cited

U.S. PATENT DOCUMENTS 7,103,855 B2 *   9/2006  Saeki ............................ 716/1
7,240,249 B2 *   7/2007  Buchmann et al. ........... 714/700
7,567,118 B2 *   7/2009  Azuma et al. ................ 327/536
7,605,629 B2 *  10/2009  Kuo et al. .................... 327/261
2006/0238227 A1 *  10/2006  Kim et al. ................... 327/158
2010/0097114 A1 *   4/2010  Miyazaki et al. ............ 327/176

FOREIGN PATENT DOCUMENTS

| JP | 1993191237 A | 7/1993 |
| JP | 2000077990 A | 3/2000 |
| JP | 2001350539 A | 12/2001 |
| JP | 2006186660 A | 7/2006 |

* cited by examiner

*Primary Examiner*—Tuan Lam
*Assistant Examiner*—Hiep Nguyen

(57) ABSTRACT

Provided is a semiconductor integrated circuit which includes a logical operation circuit, a clock generator, a relay circuit, and a signal generating unit that are integrated. The clock generator generates multiphase clocks. The relay circuit distributes the generated multiphase clocks to the logical operation circuit. The signal generating unit detects phase states of the distributed multiphase clocks and, based on the detected phase states, generates an analog voltage signal having a voltage value indicative of a phase error in the multiphase clocks.

15 Claims, 11 Drawing Sheets

SEMICONDUCTOR INTEGRATED CIRCUIT

This application is based on and claims priority from Japanese Patent Application No. 2008-097156 filed Apr. 3, 2008, which is hereby incorporated by reference.

BACKGROUND

1. Technical Field

The present invention relates to a technique for detecting phases of multiphase clocks and, more particularly, to a technique for detecting a phase error in multiphase clocks used in a semiconductor integrated circuit.

2. Related Art

There is a case that multiphase clocks are used for, for example, high-speed parallel arithmetic operation as operation clocks of a semiconductor integrated circuit (hereinafter referred to as the "integrated circuit") such as an LSI. The multiphase clocks are a group of clock signals having the same cycle and different phases. Typically, N-phase clocks (N is an integer of 2 or larger) is clock signals of the zero-th phase to the (N−1)-th phase having the same cycle. The clock signal of the k-th phase (k is any of zero to N−1) is a signal delayed from the clock signal of the zero-th phase by (T/N)·k (where T=1 cycle). As disclosed in Japanese Unexamined Patent Publication No. 2001-350539, multiphase clocks can be generated by using a PLL (Phase-Locked Loop) circuit.

The phases of the multiphase clocks may be deviated due to variations in the interconnection width and thickness in an integrated circuit or due to ambient environment such as temperature. For example, in the N-th phase clock, the phase difference between the clock signals having the k-th and (k+1)-th phases has to be maintained to 2π/N. When multiphase clocks are transmitted in the integrated circuit, there is the case where the phase difference becomes not equal to 2π/N and a phase error occurs.

For example, a technique of correcting a phase shift of a clock signal is disclosed in Japanese Patent Application Publication Nos. 2006-186660, H05-191237, and 2000-077990.

Conventionally, a test on the phase states of multiphase clocks in an integrated circuit is conducted by transferring multiphase clocks from an output buffer built in the integrated circuit to an external measuring device (for example, an oscilloscope) and measuring the pulse waveforms of the transferred multiphase clocks by the external measuring device. In such measurement, a phase error occurring when the multiphase clocks are distributed in the integrated circuit is detected, and a detection result can be reflected in product development. However, to test the phase states of the multiphase clocks of high frequencies, an output buffer of high efficiency which can operate at high speed has to be assembled in an integrated circuit. It causes a problem that the design cost of the integrated circuit and the circuit scale increase.

SUMMARY

In view of the foregoing, it is an exemplary object of the present invention to provide a semiconductor integrated circuit capable of detecting phase states of multiphase clocks without requiring use of an output buffer.

According to an exemplary aspect of the present invention, there is provided a first semiconductor integrated circuit which includes: a logical operation circuit which operates synchronously with distributed multiphase clocks; a clock generator which generates multiphase clocks of a plurality of clock signals having the same cycle and having respective different phases; a relay circuit which distributes the generated multiphase clocks to the logical operation circuit; a signal generating unit which detects phase states of the distributed multiphase clocks and generates an analog voltage signal having a voltage value indicative of a phase error in the distributed multiphase clocks on the basis of the defected phase states; and an output port which outputs the analog voltage signal to the outside thereof. The logical operation circuit, the clock generator, the relay circuit, and the signal generating unit are integrated.

According to another exemplary aspect of the present invention, there is provided a second semiconductor integrated circuit which includes: a logical operation circuit which operates synchronously with distributed multiphase clocks; a clock generator which generates multiphase clocks of a plurality of clock signals having the same cycle and having respective different phases; a relay circuit which distributes the generated multiphase clocks to the logical operation circuit and adjusts phases of the multiphase clocks in accordance with a control signal being supplied by an outside source; a signal generating unit which detects phase states of the distributed multiphase clocks and generates an analog voltage signal having a voltage value indicative of a phase error in the distributed multiphase clocks on the basis of the detected phase states; and a delay control unit which generates the control signal so as to reduce the phase error in response to the analog voltage signal. The logical operation circuit, the clock generator, the relay circuit, the signal generating unit, and the delay control unit are integrated.

The first semiconductor integrated circuit as an exemplary aspect of the present invention can convert a phase error in multiphase clocks to a voltage value and supply an analog voltage signal having the voltage value to an external measuring device via an output port. Consequently, it is unnecessary to assemble an output buffer capable of operating at high speed to detect the phase states of multiphase clocks of high frequencies in an integrated circuit. Therefore, by the first semiconductor integrated circuit, the phase states of the multiphase clocks of high frequencies can be detected without using the output buffer.

The second semiconductor integrated circuit as another exemplary aspect of the present invention can convert a phase error in the multiphase clocks to a voltage value and, based on an analog voltage signal having the voltage value, adjust the phases of the multiphase clocks. Consequently, the second semiconductor integrated circuit can properly adjust the phases of the multiphase clocks with a relatively simple configuration.

Further features of the invention, its nature and various advantages will be more apparent from the accompanying drawings and the following detailed description of various exemplary embodiments.

BRIEF DESCRIPTION OF THE DRAWINGS

The above and other objects, advantages and features of the present invention will be more apparent from the following description of certain exemplary embodiments taken in conjunction with the accompanying drawings, in which.

DETAILED DESCRIPTION

The invention will now be described with reference to illustrative exemplary embodiments. Those skilled in the art will recognize that various alternative embodiments can be accomplished using the teachings herein, and that the invention is not limited to exemplary embodiments illustrated for explanatory purposes.

First Exemplary Embodiment

Figure 1:
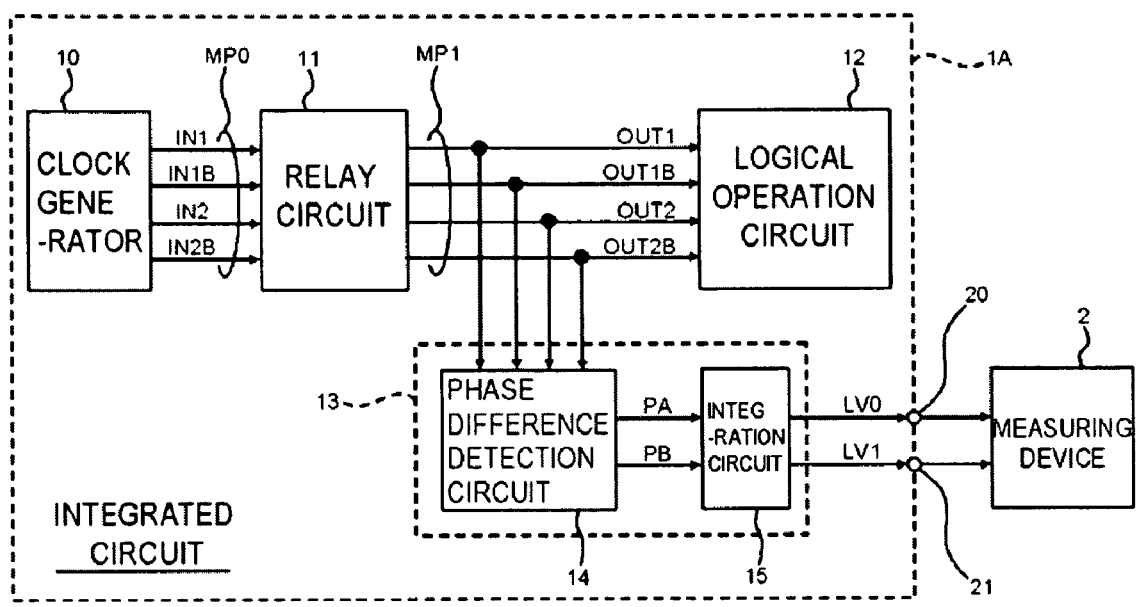
FIG. 1 is a block diagram showing a schematic configuration of an integrated circuit of a first exemplary embodiment of the present invention.

FIG. 1 is a block diagram showing a schematic configuration of an integrated circuit 1A as a first exemplary embodiment of the present invention. The integrated circuit 1A has a clock generator 10, a relay circuit 11, a logical operation circuit 12, and a signal generating unit 13. The signal generating unit 13 has a phase difference detection circuit 14 and an integration circuit 15. The clock generator 10, the relay circuit 11, the logical operation circuit 12, and the signal generating unit 13 are integrated on a semiconductor substrate.

The clock generator 10 has therein a PLL circuit and has the function of generating 4-phase clocks MP0 by using the PLL circuit. The 4-phase clocks MP0 are a group of clock signals having the same cycle (one clock cycle) and having their respective different phases. Specifically, the 4-phase clocks MP0 are made of a zero-th phase clock signal IN1, a first phase clock signal IN2, a second phase clock signal IN1B, and a third phase clock signal IN2B.

The relay circuit 11 is a circuit for relaying the multiphase clocks MP0 generated by the clock generator 10 and distributing the multiphase clocks MP0 to the logical operation circuit 12. Multiphase clocks MP1 output from the relay circuit 11 is made of a zero-th phase clock signal OUT1, a first phase clock signal OUT2, a second phase clock signal OUT1B, and a third phase clock signal OUT2B. Although the clock signals IN1, IN1B, IN2, and IN2B input to the relay circuit 11 have the same cycle, a phase difference between clock signals having their respective neighboring phases of the multiphase clocks MP0 are not always constant. When the multiphase clocks MP0 are transmitted, due to variations in the interconnection width and thickness in the integrated circuit or the ambient environments such as temperature, the phase difference between clock signals having neighboring two phases may shift from $2\pi/4$.

Figure 2:
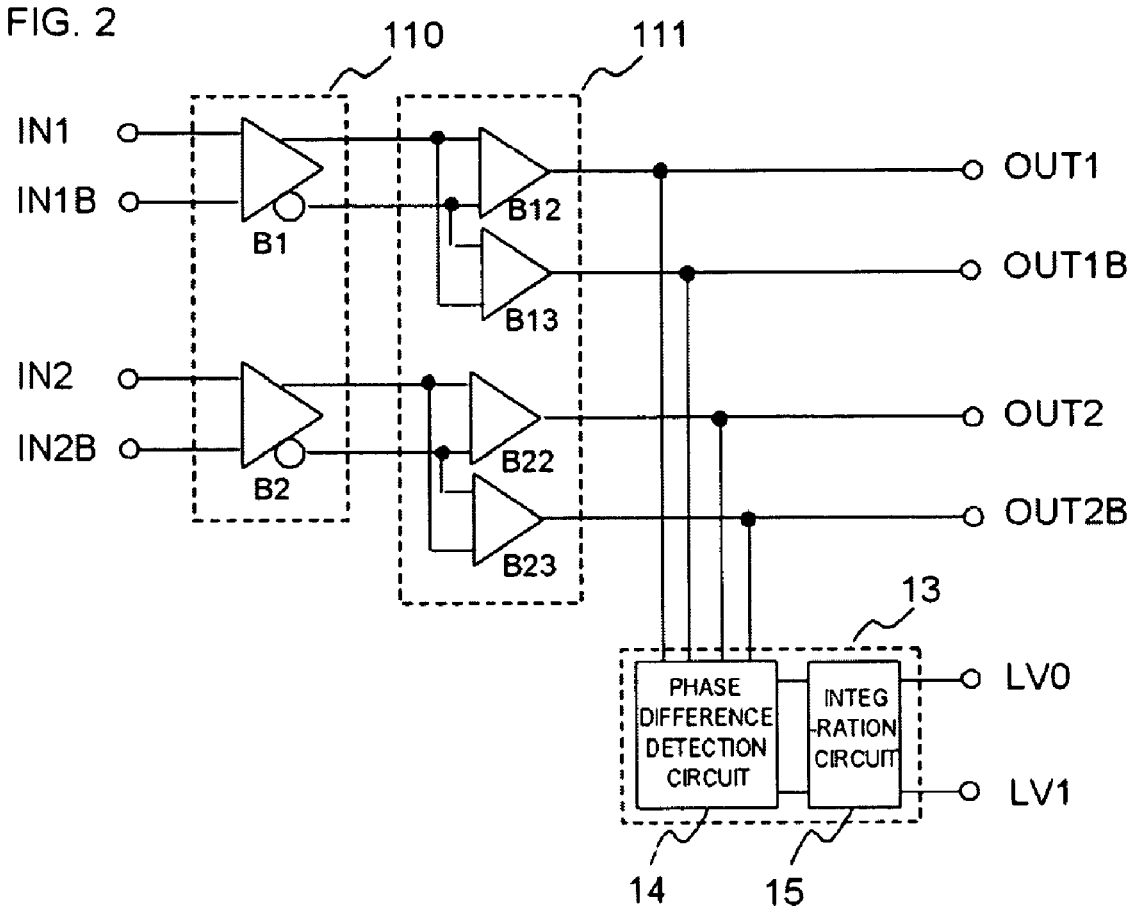
FIG. 2 is a diagram showing an example of the circuit configuration of a relay circuit.

FIG. 2 is a diagram showing an example of the circuit configuration of the relay circuit 11. As shown in FIG. 2, the relay circuit 11 is constructed by an input/output buffer circuit 110 and a level converting circuit 111. The input/output buffer circuit 110 is a circuit for performing buffering operation (buffering) so that the output level becomes almost constant even in the case where the amplitudes of the multiphase clocks MP0 which is input fluctuate. The input/output buffer circuit 110 is constructed by differential buffer circuits B1 and B2. The differential buffer circuits B1 and B2 are current mode logic circuits such as CML (Current Mode Logic) buffers or ECL (Emitter Coupled Logic) buffer. The differential buffer circuit B1 receives the zero-th phase clock signal IN1 and the second phase clock signal IN1B having a logic level obtained by inverting the logic level of the zero-th phase clock signal IN1. The differential buffer circuit B1 buffers the zero-th phase clock signal IN1 and the second phase clock signal IN1B which are received and, after that, outputs the buffered signals as the zero-th phase clock signal OUT1 and the second phase clock signal OUT1B, respectively. The other differential buffer circuit B2 receives the first phase clock signal IN2 and the second phase clock signal IN2B having a logic level obtained by inverting the logic level of the first phase clock signal IN2. The buffer circuit B2 buffers the first phase clock signal IN2 and the third phase clock signal IN2B which are received and, after that, outputs the buffered signals as the first phase clock signal OUT2 and the third phase clock signal OUT2B, respectively.

The level converting circuit 111 in FIG. 2 has the function of converting the voltage amplification level adapted to the logic levels of the multiphase clocks output from the input/output buffer circuit 110, into the logic level defined in the logical operation circuit (for example, a CMOS logic circuit) 12. In the level converting circuit 111, each of level converters B12 and B13 converts the output level of the buffer circuit B1, and each of level converters B22 and B23 converts the output level of the buffer circuit B2. As a result, the level converters B12, B13, B22, and B23 output the zero-th phase clock signal OUT1, the second phase clock signal OUT1B, the first phase clock signal OUT2, and the third phase clock signal OUT2B, respectively.

The signal generating unit 13 detects phase states of the four-phase clocks MP1 and, based on the detected phase states, generates analog voltage signals LV0 and VL1 having voltage values indicative of a phase error in the fourth-phase clocks MP1. Concretely, the signal generating unit 13 includes the phase difference detection circuit 14 and the integration circuit 15. The phase difference detection circuit 14 has the function of detecting the phase difference among at least a set of clock signals constructing the four-phase clocks MP1 and generating a phase difference signal having a pulse width corresponding to the detected phase difference. In the exemplary embodiment, the phase difference detection circuit 14 generates a phase difference signal PA comprised of a set of clock signals OUT1 and OUT2 in the four-phase clock MP1. The phase difference detection circuit 14 generates an inverted phase difference signal PB of a set of clock signals OUT1B and OUT2B in the four-phase clocks MP1. That is, the phase difference signal PA is a signal having a pulse width corresponding to the phase difference between the zero-th phase clock signal OUT1 and the first phase clock signal OUT2. The inverted phase difference signal PB is a signal obtained by inverting the logic level of a pulse signal having the pulse width corresponding to the phase difference between the second phase clock signal OUT1B and the third phase clock signal OUT2B.

The integration circuit 15 integrates the phase difference signal PA and the inverted phase difference signal PB and generates signals having voltage values corresponding to pulse widths as the analog voltage signals LV0 and LV1. The generated analog voltage signals LV0 and LV1 are output to an external measuring device 2 via output ports 20 and 21. The measuring device 2 has the function of displaying pulse waveforms of the analog voltage signals LV0 and LV1 received from the output ports 20 and 21 and also has the function of analyzing the pulse waveforms and displaying the analysis result. The user can detect the phase states of the multiphase clocks MP1 based on the pulse waves and the analysis result.

The effects produced by the integrated circuit 1A of the first exemplary embodiment are as follows. As described above, the integrated circuit 1A detects the phase differences among at least a set of clock signals OUT1 and OUT2 in the multiphase clocks MP1 distributed to the logical operation circuit 12, and generates the phase difference signal PA having the pulse width corresponding to the detected phase difference. The integrated circuit 1A integrates the phase difference signal PA to generate the analog voltage signal LV0. The measuring device 2 can detect the phase states of the multiphase clocks MP1 based on the analog voltage signal LV0. Consequently, it is unnecessary to assemble an output buffer which can operate at high speed to test the phase states of the multiphase clocks MP1 of high frequencies into the integrated circuit 1A. Therefore, the phase states of the multiphase clocks of high frequency can be detected by the integrated circuit 1A without using the output buffer.

The integrated circuit 1A generates the inverted phase difference signal PB of the other set of clock signals OUT1B and OUT2B in the four-phase clocks MP1, and integrates the inverted phase difference signal PB, thereby generating the analog voltage signal LV1. Using the analog voltage signals LV0 and LV1, the measuring device 2 can detect the phase states of the multiphase clocks of high frequencies at higher precision.

Second Exemplary Embodiment

Figure 3:
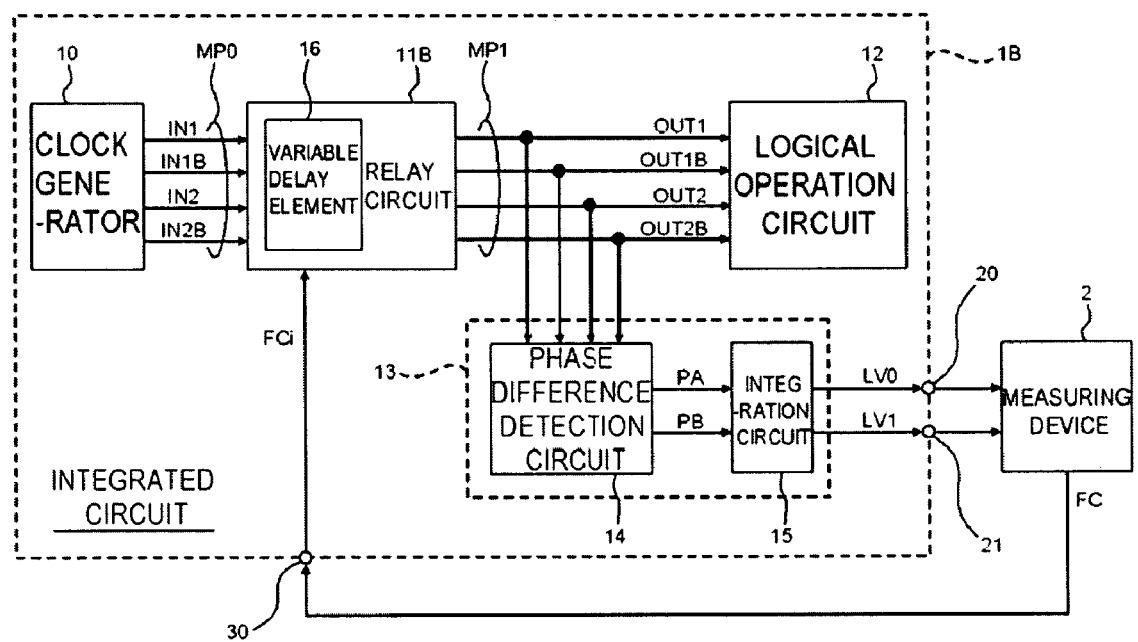
FIG. 3 is a block diagram showing a schematic configuration of an integrated circuit of a second exemplary embodiment of the invention.

A second exemplary embodiment of the present invention will now foe described. FIG. 3 is a block diagram showing a schematic configuration of an integrated circuit 1B of the second exemplary embodiment. The integrated circuit 1B has the clock generator 10, a relay circuit 11B, the logical operation circuit 12, the signal generating unit 13, the output ports 20 and 21, and an input port 30. The configuration of the integrated circuit 1B is the same as that of the integrated circuit 1A of the first exemplary embodiment except for the configuration (FIG. 1) of the relay circuit 11B and the input port 30.

In the second exemplary embodiment, the relay circuit 11B of the integrated circuit 1B has the function of relaying the multiphase clocks MP0 generated by the clock generator 10 like the relay circuit 11 in FIG. 1 and distributing it to the logical operation circuit 12 and also has a variable delay element 16. The variable delay element 16 delays at least one of input clock signals IN1, IN1B, IN2, and IN2B in response to an internal feedback control signal FCi and adjusts the phases of the output clock signals OUT1, OUT1B, OUT2, and OUT2B.

In the exemplary embodiment, the measuring device 2 functions as a feedback control system which responds to the analog voltage signals LV0 and LV1. That is, the measuring device 2 generates a feedback control signal FC for adjusting one or more delay times with respect to at least one of the input clock signals IN1, IN1B, IN2, and IN2B so as to reduce the phase differences among the multiphase clocks MP0 and supplies the signal PC to the input port 30. The input port 30 supplies the feedback control signal FC received from the measuring device 2 as the internal feedback control signal FCi to the variable delay element 16.

Figure 4:
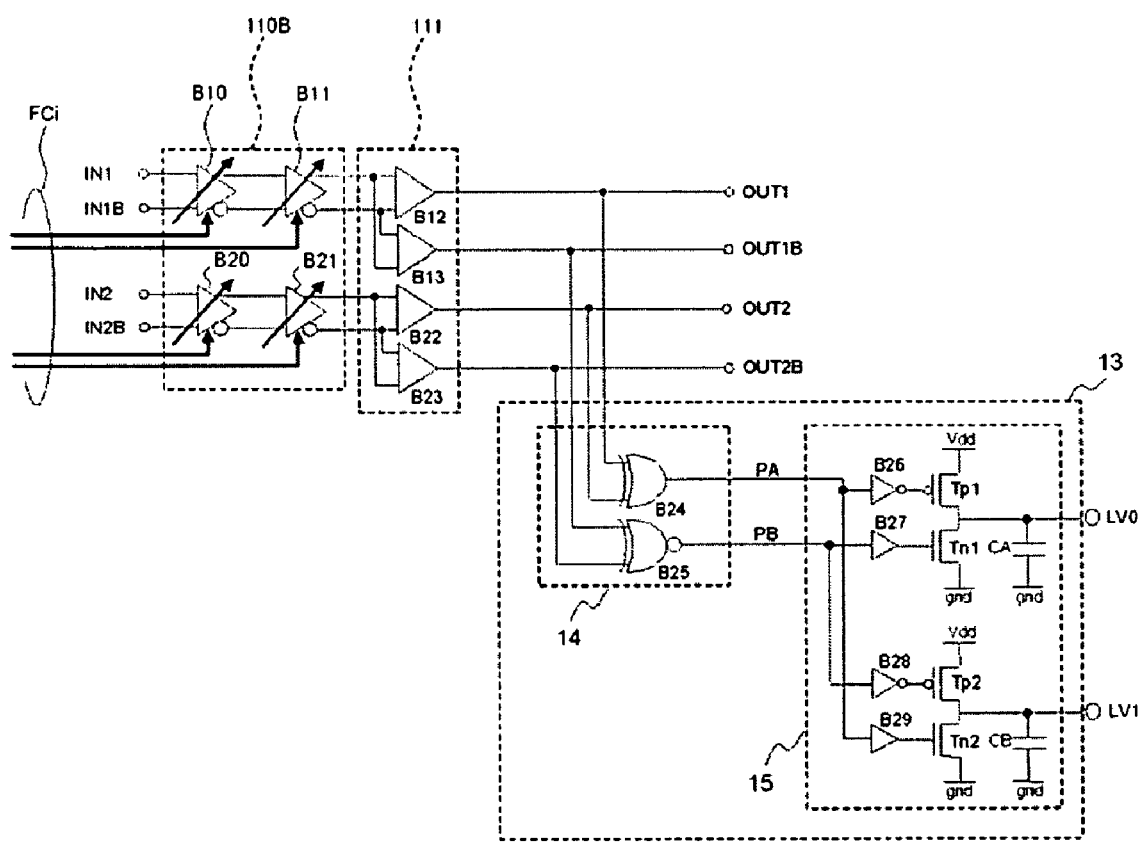
FIG. 4 is a diagram showing a first circuit configuration of the integrated circuit of the second exemplary embodiment.

FIG. 4 is a diagram showing a first circuit configuration of the integrated circuit 1B. In the circuit configuration of FIG. A, the relay circuit 11B is constructed by an input/output buffer circuit 110B and the level converting circuit 111. The level converting circuit 111 in FIG. 4 has the same function as that of the level converting circuit 111 in FIG. 2.

The input/output buffer circuit 110B has the function of buffering the clock signals IN1, IN1B, IN2, and IN2B. The input/output buffer circuit 110B is constructed by four differential buffer circuits B10, B11, B20, and B21. The differential buffer circuits B10, B11, B20, and B21 are current mode logic circuits such as a CML (Current Mode Logic) buffer, an ECL (Emitter Coupled Logic) buffer, or the like.

The differential buffer circuits B10, B11, B20, and B21 have the variable delay function of delaying the clock signals IN1, IN1B, 1N2, and IN2B in response to the internal feedback control signal FCi. Therefore, the variable delay element 16 in FIG. 3 is constructed by the differential buffer circuits B10, B11, B20, and B21.

The differential buffer circuit B10 receives the zero-th clock signal IN1 and the second phase clock signal IN1B having a logic level obtained by inverting the logic level of the zero-th phase clock signal IN1, buffers the received clock signals IN1, and IN1B and, outputs the buffered signals to the differential buffer circuit B11 at the post stage. The differential buffer circuit B11 buffers an output of the buffer circuit B10 at the ante stage and outputs the buffered signals to the level converting circuit 111. On the other hand, the differential buffer circuit B20 receives the first phase clock signal IN2 and the third phase clock signal IN2B having a logic level obtained by inverting the logic level of the first phase clock signal IN2, buffers the received, clock signals IN2 and IN2B and, after that, outputs the buffered signals to the differential buffer circuit B21 at the post stage. The differential buffer circuit B21 buffers an output of the buffer circuit B20 at the ante stage and outputs the buffered signals to the level converting circuit 111.

As shown in FIG. 4, the phase difference detection circuit 14 includes two XOR gates (exclusive OR circuits) B24 and B25. The XOR gate B24 performs exclusive-OR operation on the first set of the clock signals OUT1 and OUT2 of the zero-th and first phases, thereby generating the phase difference signal PA having the pulse width corresponding to the phase difference between the clock signals OUT1 and OUT2. The other XOR gate B25 performs exclusive-OR operation on the second set of the clock signals OUT1B and OUT2B of the second and third phases and, further, inverts the logic level of the operation result, thereby generating the inverted phase difference signal PB. The inverted phase difference signal PB is a signal obtained by inverting the logic level of a pulse signal having a pulse width corresponding to the phase difference between the clock signals OUT1B and OUT2B.

As shown in FIG. 4, the integration circuit 15 has an inverting circuit (inverter circuit) 226, a non-inverting circuit B27, a p-channel type transistor (first switching transistor) Tp1, an n-channel type transistor (second switching transistor) Tn1, and a capacitor CA. The components B26, B27, Tp1, Tn1, and CA construct a first RC filter circuit.

In the first RC filter circuit, the p-channel type transistor Tp1 and the n-channel type transistor Tn1 are connected, in series. The source electrode of the p-channel type transistor Tp1 is connected to a power source voltage terminal for supplying a power source voltage Vdd. The source electrode of the n-channel type transistor Tn1 is connected to a ground voltage terminal (gnd terminal). One end of the capacitor CA is connected to the drain electrode of the p-channel type transistor Tp1 and is also connected to a voltage output terminal. The other end of the capacitor CA is grounded. The inverting circuit B26 inverts the logic level of the phase difference signal PA to generate an inversion signal, and applies the inversion signal to the gate electrode of the p-channel type transistor Tp1. The non-inverting circuit B27 applies the inverted phase difference signal PB to the gate electrode of the n-channel type transistor Tn1.

In such a first RC filter circuit, the p-channel type transistor Tp1 and the n-channel type transistor Tn1 perform switching operation in response to the phase difference signal PA and the inverted phase difference signal PB. Only when the logic level of the phase difference signal PA is "H (High)", the p-channel type transistor Tp1 is turned on, and the power source voltage terminal is connected to one end of the capacitor CA to charge the capacitor CA. When the logic level of the phase difference signal PA is "L (Low)", the p-channel type transistor Tp1 is turned off. When the logic level of the phase difference signal PA is "L", the logic level of the inverted phase difference signal PB is "H", so that the n-channel type transistor Tn1 is turned on. In this case, the n-channel type transistor Tn1 connects one end of the capacitor CA to the ground voltage terminal to discharge the capacitor CA. In the first RC filter circuit, the inverted phase difference signal PB can be used as a signal having the logic level obtained by inverting the logic level of the phase difference signal PA.

As shown in FIG. 4, the integration circuit 15 has an inverting circuit (inverter) B28, a non-inverting circuit B29, a p-channel type transistor (third switching transistor) Tp2, an n-channel type transistor (fourth switching transistor) Tn2, and a capacitor CB. The components B28, B29, Tp2, Tn2, and CB construct a second RC filer circuit.

In the second RC filter circuit, the p-channel type transistor Tp1 and the n-channel type transistor Tn2 are connected in series. The source electrode of the p-channel type transistor Tp2 is connected to a power source voltage terminal for supplying the power source voltage Vdd. The source electrode of the n-channel type transistor Tn1 is connected to a ground voltage terminal (grid terminal). One end of the capacitor CB is connected to the drain electrode of the p-channel type transistor Tp1 and is also connected to a voltage output terminal. The other end of the capacitor CB is grounded. The inverting circuit B28 inverts the logic level of the phase difference signal PB to generate an inversion signal, and applies the inversion signal to the gate electrode of the p-channel type transistor Tp2. The non-inverting circuit B29 applies the phase difference signal PA to the gate electrode of the n-channel type transistor Tn2.

In such a second RC filter circuit, the p-channel type transistor Tp2 and the n-channel type transistor Tn2 perform switching operation in response to the inverted phase difference signal PB and the phase difference signal PA. Only when the logic level of the inverted phase difference signal PB is "H", the p-channel type transistor Tp2 is turned on, and the power source voltage terminal is connected to one end of the capacitor CB to charge the capacitor CB. When the logic level of the inverted phase difference signal PB is "L", the p-channel type transistor Tp2 is turned off. When the logic level of the inverted phase difference signal PB is "L", the logic level of the phase difference signal PA is "H", so that the n-channel type transistor Tn2 is turned on. In this case, the n-channel type transistor Tn2 connects one end of the capacitor CB to the ground voltage terminal to discharge the capacitor CB. In the second RC filter circuit, the phase difference signal PA can be used as a signal having the logic level obtained by inverting the logic level of the inverted phase difference signal PB.

FIGS. 5A to 5D are timing charts schematically showing an example of various signal waveforms in the first circuit configuration shown in FIG. 4. In the case where the four-phase clocks MP0 shown in FIGS. 5A to 5D is generated, in the four-phase clocks MP0, there is a phase error corresponding to time $\delta t (=-(\Delta t1 - \Delta t2)/2)$ between the clock signals IN1 and IN1B and the clock signals IN2 and IN2B ($\Delta t1 > \Delta t2$). FIGS. 5E to 5H are timing charts showing signal waveforms of the four-phase clocks MP1 output from the relay circuit 11.

The phase difference detection circuit 14 in FIG. 4 generates the phase difference signal PA (FIG. 5M) having the pulse width ($=\Delta t1$) corresponding to the phase difference between the rising edge of the clock signal OUT1 and the rising edge of the clock signal OUT2. The phase difference detection circuit 14 also generates the inverted phase difference signal PB (FIG. 5M) having the pulse width ($=\Delta t2$) corresponding to the phase difference between the rising edge of the clock signal OUT2B and the rising edge of the clock signal OUT1B.

Figure 5:
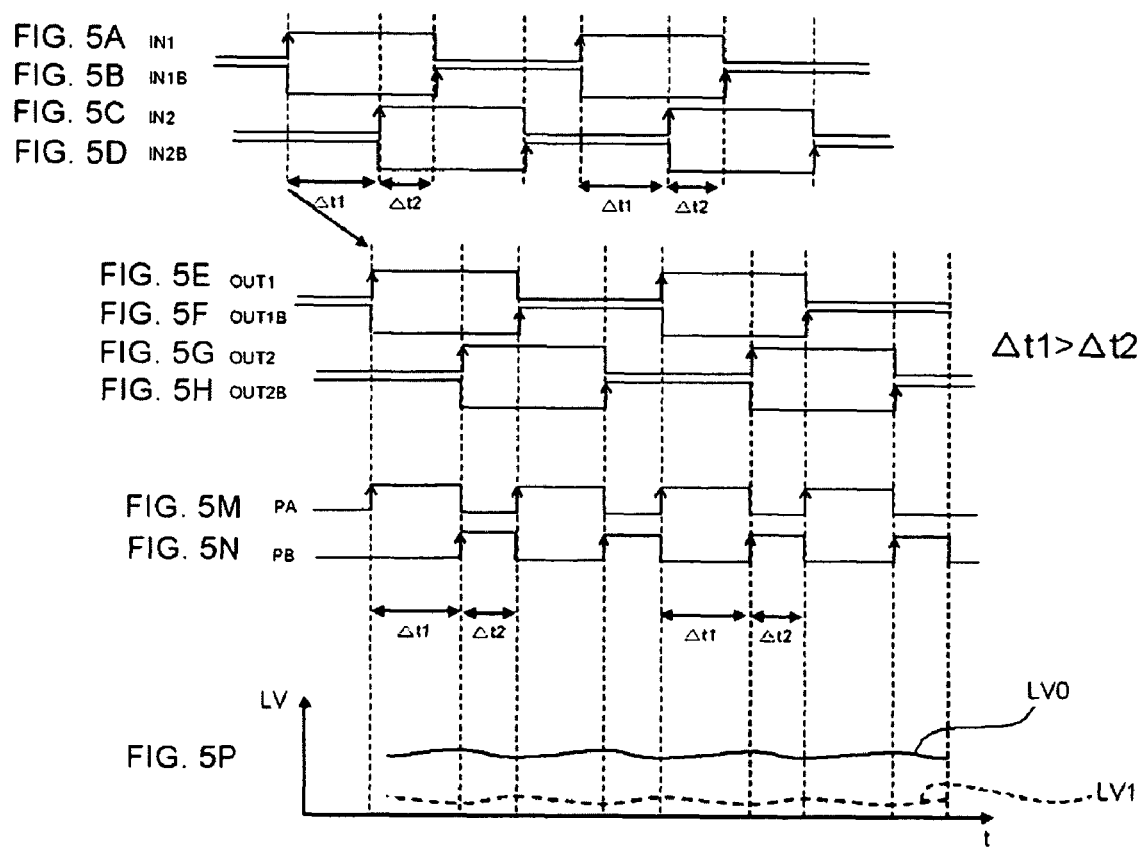
FIGS. 5A to 5P are timing charts schematically showing an example of various signal waveforms in the first circuit configuration illustrated in FIG. 4.
Figure 6:
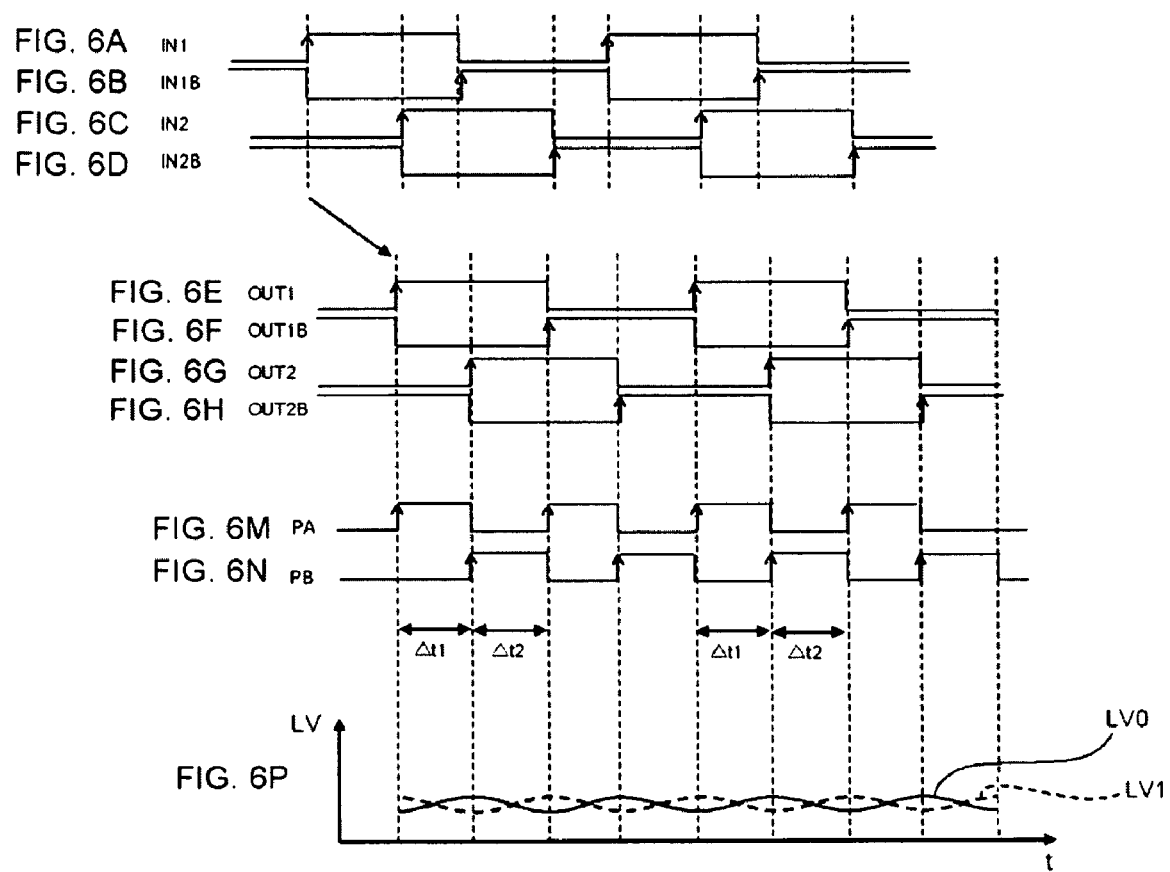
FIGS. 6A to 6P are timing charts schematically showing another example of various signal waveforms in the first circuit configuration illustrated in FIG. 4.

The integration circuit 15 in FIG. 4 integrates the phase difference signal PA to generate the analog voltage signal LV0 and, at the same time, integrates the inverted phase difference signal PB to generate the analog voltage signal LV1. FIG. 5P is a timing chart showing a change in the voltage level LV of the analog voltage signals LV0 and LV1 with respect to time "t". As shown in FIG. 5P, the voltage level of the analog voltage signals LV0 and LV1 is almost constant, and the voltage level of the analog voltage signal LV0 is higher than that of the analog voltage signal VL1. Therefore, based on the voltage level difference between the analog voltage signals LV0 and LV1, the phase error between the clock signals IN1 and IN1B and the clock signals IN2 and IN2B can be detected.

On the other hand, when there is a phase error showing the relation of $\Delta t1 < \Delta t2$ between the clock signals IN1 and IN1B and the clock signals 1N2 and IN2B, the voltage level of the analog voltage signal LV0 is higher than that of the analog voltage signal LV1.

The measuring device 2 shown in FIG. 3 can generate the feedback control signal FC for adjusting one or more delay times for the input clock signals IN1, IN1B, IN2, and IN2B so as to reduce the voltage level difference between the analog voltage signals LV0 and LV1, FIGS. 6A to 6H are timing charts showing signal waveforms of the multiphase clocks MP0 and MP1 subjected to phase adjustment. As shown in FIGS. 6M and 6N, the pulse width of the phase difference signal PA and that of the inverted phase difference signal PB are almost the same. As shown in FIG. 6P, the voltage levels of the analog voltage signals LV0 and LV1 are almost the same. Therefore, it is possible to determine whether the phase error between the clock signals IN1 and IN1B and the clock signal IN2 and IN2B lies in a permissible range or not based on the voltage level difference between the analog voltage signals LV0 and LV1.

Figure 7:
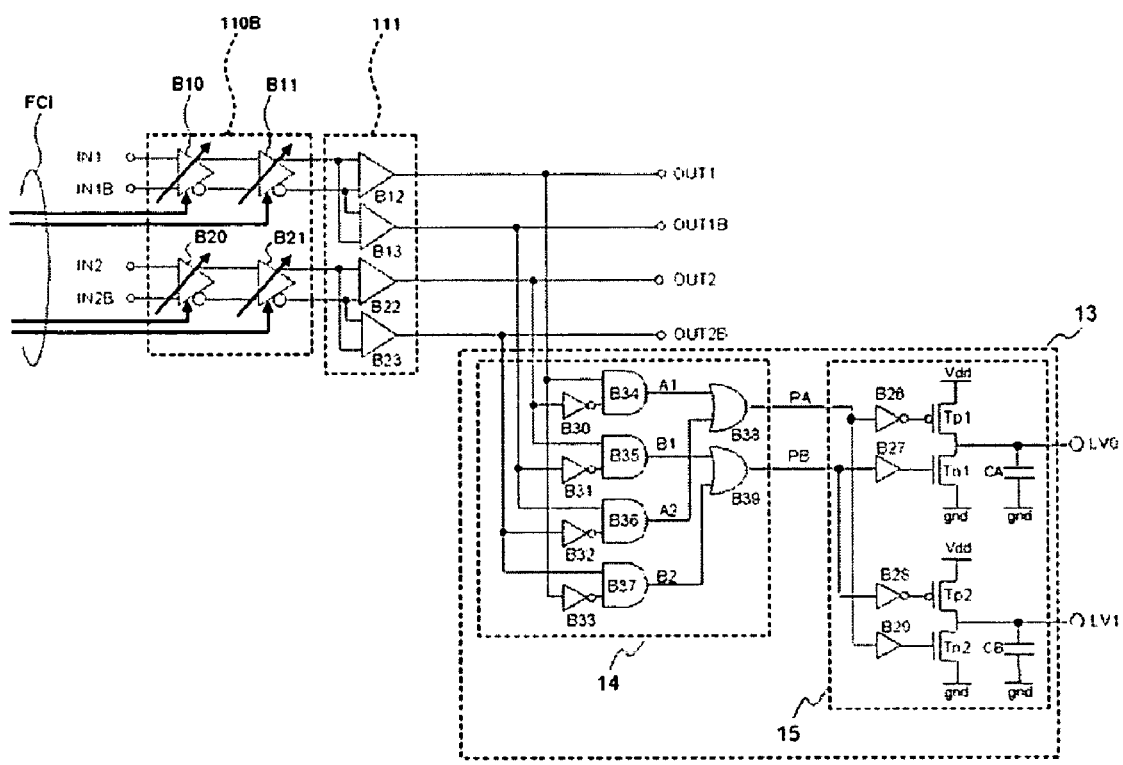
FIG. 7 is a diagram showing a second circuit configuration of the integrated circuit of the second exemplary embodiment.

A second circuit configuration of the integrated circuit 1B will now be described. FIG. 7 is a diagram showing the second circuit configuration. The second circuit configuration is the same as the first circuit configuration shown in FIG. 4 except for the phase difference detection circuit 14.

In the second circuit configuration, the phase difference detection circuit 14 includes inverters B30, B31, B32, and B33, AND gates (logical AND operation circuits) B34, B35, B36, and 337, and OR gates (OR operation circuits) B38 and B39.

As shown in FIG. 7, the inverters B30, B31, B32, and B33 invert the logic level of the first-phase clock signal OUT2, the second-phase clock signal OUT1B, the third-phase clock signal OUT2B, and the zeroth-phase clock signal OUT1, respectively.

The AND gate B34 performs AND operation on the zero-th phase clock signal OUT1 and an output of the inverter B30 and generates a phase difference signal A1 as a result of the operation. The phase difference signal A1 shows the phase difference between the rising edge of the zero-th phase clock signal OUT1 and the rising edge of the first-phase clock signal OUT2. The AMD gate B35 performs AND operation on the first-phase clock signal OUT2 and an output of the inverter B31 and generates a phase difference signal B1 as a result of the operation. The phase difference signal B1 shows the phase difference between the rising edge of the first-phase clock signal OUT2 and the rising edge of the second-phase clock signal OUT1B, The AND gate B36 performs AMD operation on the second-phase clock signal OUT1B and an output of the inverter B32 and generates a phase difference signal A2 as a result of the operation. The phase difference signal A2 shows the phase difference between the rising edge of the second-phase clock signal OUT1B and the rising edge of the third-phase clock signal OUT2B. The AND gate B37 performs AND operation on the third-phase clock signal OUT2B and an output of the inverter B33 and generates a phase difference signal B2 as a result of the operation. The phase difference signal B2 shows the phase difference between the rising edge of the third-phase clock signal OUT2B and the rising edge of the zeroth-phase clock signal OUT1.

The OR gate B38 in FIG. 7 performs logical OR operation on the phase difference signals A1 and A2 to generate the phase difference signal PA. The OB gate B39 performs logical OR operation on the phase difference signals B1 and B2 to generate the inverted phase difference signal PB.

Figure 8:
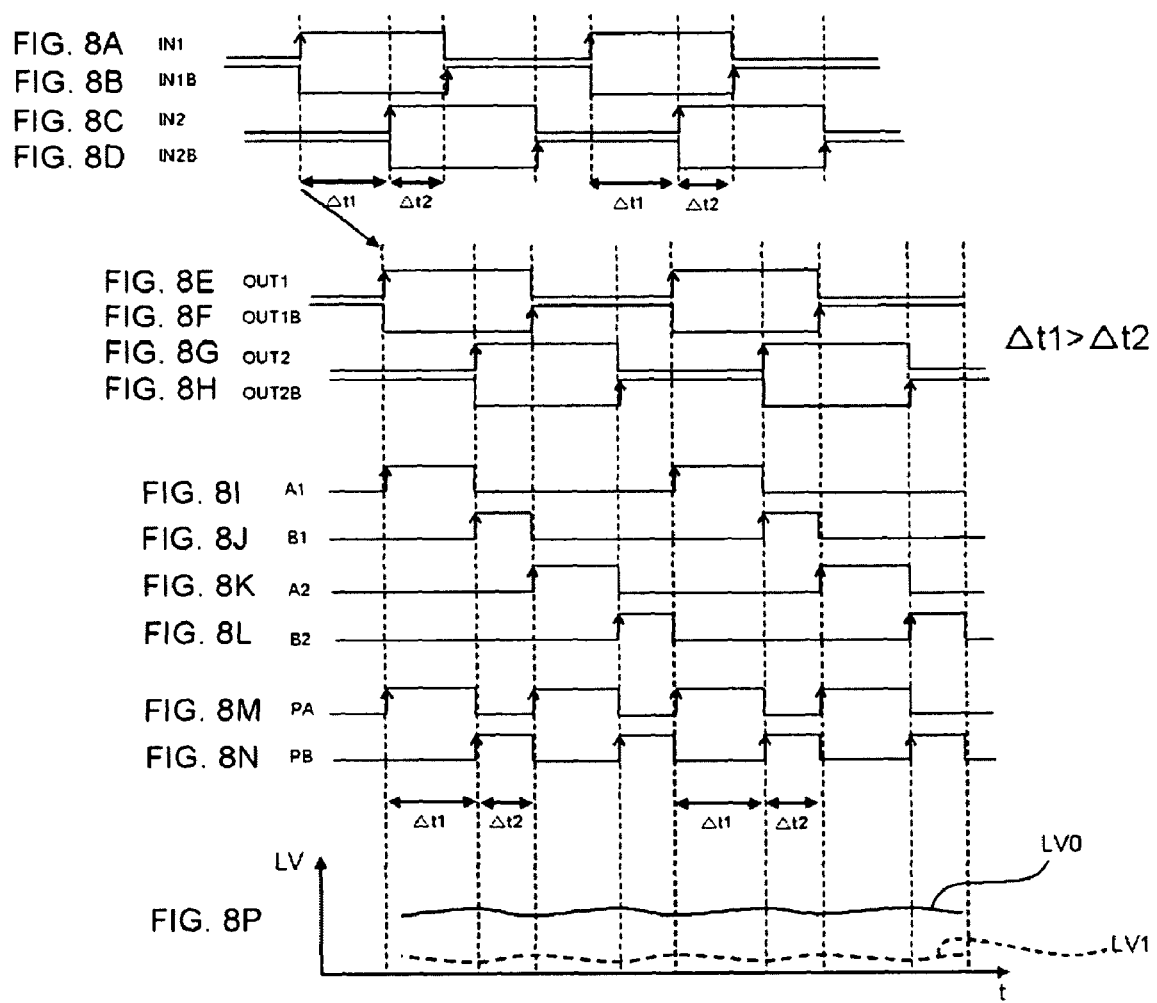
FIGS. 8A to 8P are timing charts schematically showing an example of various signal waveforms in the second circuit configuration illustrated in FIG. 7.
Figure 9:
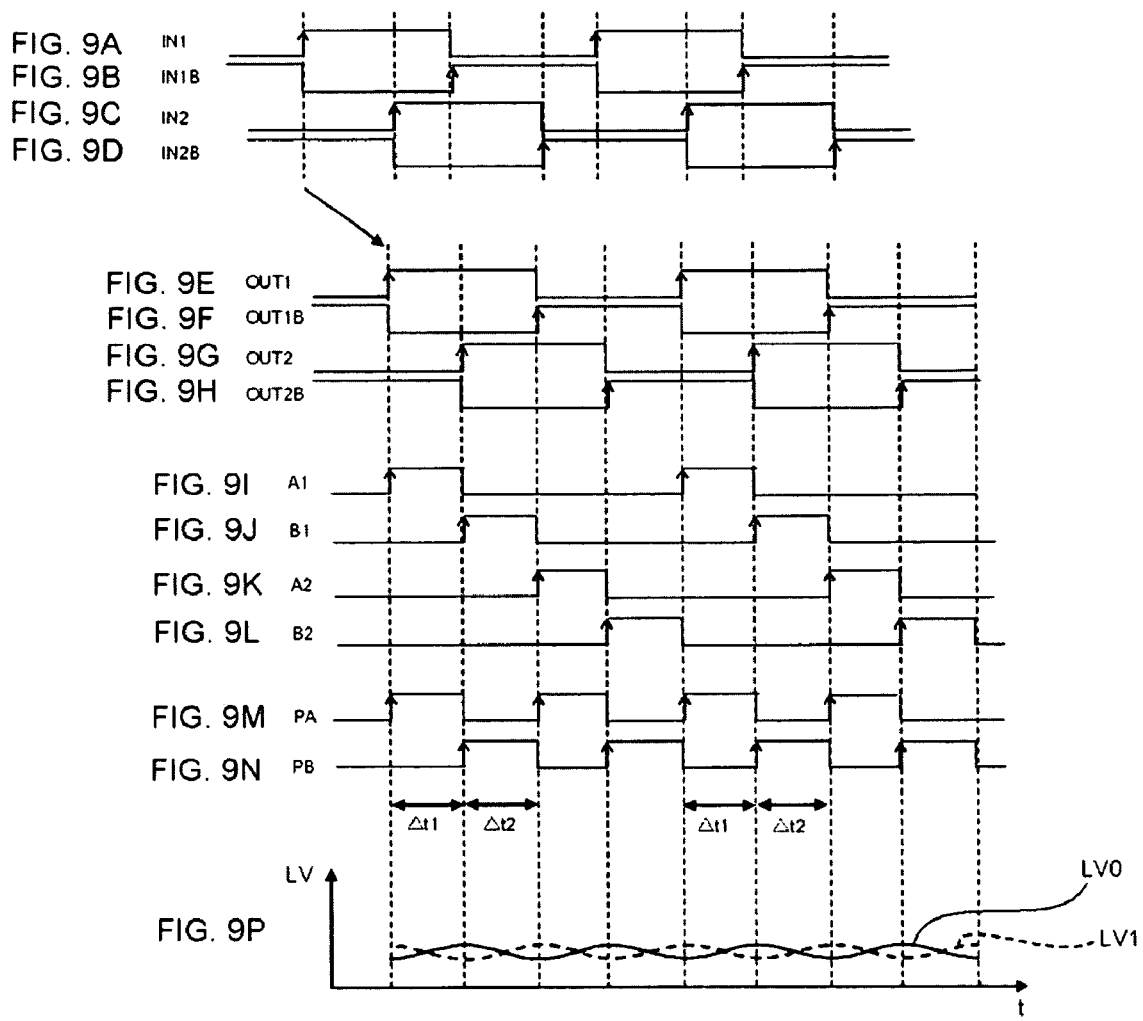
FIGS. 9A to 9F are timing charts schematically showing an example of various signal waveforms in the second circuit configuration illustrated in FIG. 7.

FIGS. 8A to 8P are timing charts showing an example of various signal waveforms in the second circuit configuration. FIGS. 8A to 8H show signal waveforms of the multiphase clocks MP0 and MP1 in the case where a phase error showing the relation of Δt1>Δt2. FIGS. 8I to 8L show waveforms of the signals A1, B1, A2, and B2 generated by the phase difference detection circuit 14 in FIG. 7. As shown in FIGS. 8M and 8N, the phase difference signal PA and the inverted phase difference signal PB show signal waveforms similar to those of FIGS. 5M and 5N. Therefore, the signal waveforms of the analog voltage signals LV0 and LV1 shown in FIG. 8P are also similar to the signal waveforms shown in FIG. 5P. FIGS. 9A to 9H are timing charts showing signal waveforms of the multiphase clocks MP0 and MP1 subjected to phase adjustment by using the second circuit configuration, FIGS. 9I to 9L show waveforms of the signals A1, B1, A2, and B2 subjected to the phase adjustment. Like FIGS. 6M and 6N, the phase difference signal PA and the inverted phase difference signal PB shown in FIGS. 9M and 9N have almost the same pulse width. As shown in FIG. 9P, the voltage levels of the analog voltage signals LV0 and LV1 are almost the same.

As described above, the phase difference detection circuit 14 in FIG. 7 detects the phase difference between the zeroth-phase clock signal OUT1 and the first-phase clock signal OUT2, the phase difference between the first-phase clock signal OUT2 and the second-phase clock signal OUT1B, the phase difference between the second-phase clock signal OUT1B and the third-phase clock signal OUT2B, and the phase difference between the third-phase clock signal OUT2B and the zeroth-phase clock signal OUT1, and generates the phase difference signal PA and the inverted phase difference signal PB based on the detected four phase differences. Therefore, the second, circuit configuration is more complicated than the first circuit configuration but can detect the phase states of the multiphase clocks MP1 more accurately.

Figure 10:
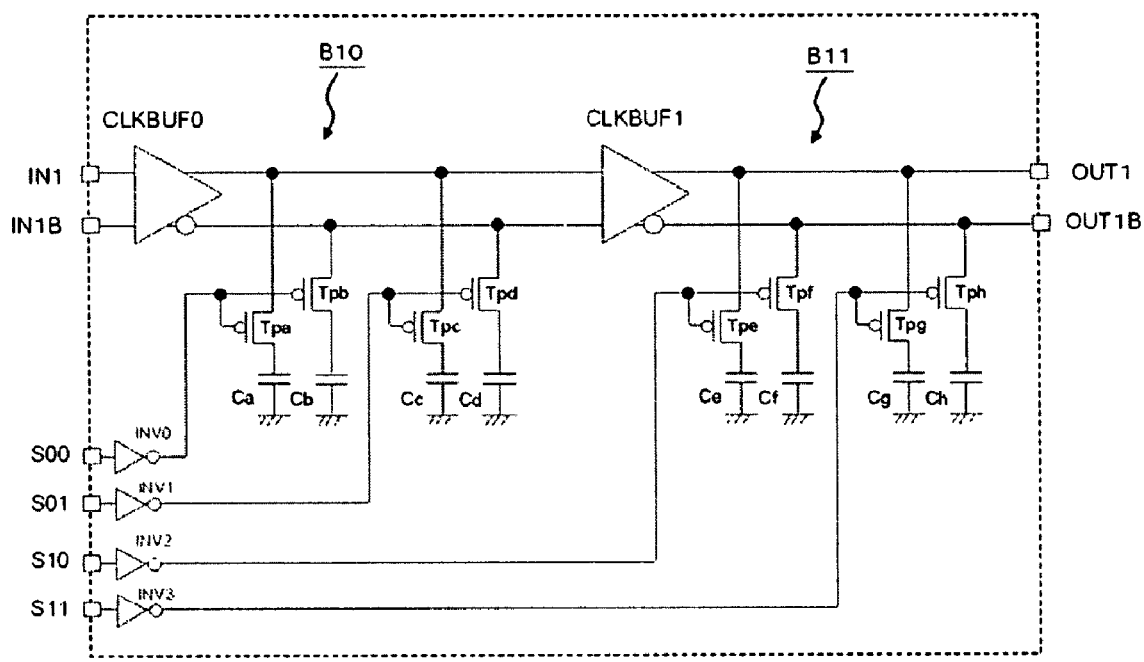
FIG. 10 is a diagram showing a part of a more concrete configuration of an input/output buffer circuit having a variable delay function illustrated in FIGS. 4 and 7.

FIG. 10 is a diagram showing a part of a more concrete configuration of the input/output buffer circuit 110B having the varying delay function illustrated in FIGS. 4 and 7. FIG. 10 shows the configuration of the buffer circuits B10 and B11. The configuration of the buffer circuits B20 and B21 in FIGS. 4 and 7 is the same as that of FIG. 10.

As shown in FIG. 10, the buffer circuit B10 at the ante stage includes a clock buffer CLKBUF0, p-channel-type transistors Tpa, Tpb, Tpc, and Tpd, and capacitors (capacitive loads) Ca, Cb, Cc, and Cd. The clock buffer CLKBUF0 receives the clock signals IN1 and IN1B, buffers the signals, and outputs the buffered signals to a clock buffer CLKBUF1 in the buffer circuit B11 at the post stage. One end of each of the capacitors Ca, Cb, Cc, and Cd is grounded. The p-channel-type transistor Tpa performs the switching operation in response to an output of an inverter INV0 and, only in a turned ON state, connects a first output terminal of the clock buffer CLKBUF0 to the other end of the capacitor Ca. The p-channel-type transistor Tpb performs the switching operation in response to an output of the inverter INV0 and, only in a turned ON state, connects a second output terminal of the clock buffer CLKBUF0 to the other end of the capacitor Cb. The p-channel-type transistor Tpc performs the switching operation in response to an output of an inverter INV1 and, only in a turned ON state, connects a first output terminal of the clock buffer CLKBUF0 to the other end of the capacitor Cc. The p-channel-type transistor Tpd performs the switching operation in response to an output of the inverter INV1 and, only in a turned ON state, connects a second output terminal of the clock buffer CLKBUF0 to the other end of the capacitor Cd.

The buffer circuit B11 at the post stage includes the clock buffer CLKBUF1, p-channel-type transistors Tpe, Tpf, Tpg, and Tph, and capacitors (capacitive loads) Ce, Cf, Cg, and Ch. The clock buffer CLKBUF1 receives the clock signals IN1 and IN1B, buffers the signals, and outputs the clock signals OUT1 and OUT1B. One end of each of the capacitors Ce, Cf, Cg, and Ch is grounded. The p-channel-type transistor Tpe performs the switching operation in response to an output of an inverter INV2 and, only in a turned ON state, connects a first output terminal of the clock buffer CLKBUF1 to the other end of the capacitor Ce. The p-channel-type transistor Tpf performs the switching operation in response to an output of the inverter INV2 and, only in a turned ON state, connects a second output terminal of the clock buffer CLKBUF1 to the other end of the capacitor Cf. The p-channel-type transistor Tpg performs the switching operation in response to an output of an inverter INV3 and, only in a turned ON state, connects a first output terminal of the clock buffer CLKBUF1 to the other end of the capacitor Cg. The p-channel-type transistor Tph performs the switching operation in response to an output of the inverter INV3 and, only in a turned ON state, connects a second output terminal of the clock buffer CLKBUF1 to the other end of the capacitor Ch.

The inverters INV0 and INV1 invert the logic levels of a first control signal S00 and a second control signal S01, respectively. The inverters INV2 and 1NV3 invert the logic levels of a third control signal S10 and a fourth control signal S11, respectively. The first, second, third, and fourth control signals S00, S01, S10, and S11 construct the feedback control signal FCi. By the first, second, third, and fourth control signals S00, S01, S10, and S11, the timings of charging/discharging the capacitors Ca, Cb, Cc, Cd, Ce, Cf, Cg, and Ch are controlled so that each of the clock signals IN1 and IN1B can be delayed by a desired delay time.

The effects produced by the integrated circuit 1B of the second exemplary embodiment are as follows. Like the integrated circuit 1A of the first exemplary embodiment, the integrated circuit 1B generates the phase difference signal PA and integrates the phase difference signal PA to generate the analog voltage signal LV0. The measuring device 2 can detect the phase states of the multiphase clocks MP1 based on the analog voltage signal LV0. Consequently, it is unnecessary to assemble an output buffer which can operate at high speed to test the phase states of the multiphase clocks MP1 of high frequency into the integrated circuit 1B. The integrated circuit 1B generates the inverted phase difference signal PB, integrates the inverted phase difference signal PB to generate the analog voltage signal LV1. Therefore, the measuring device 2 can detect the phase states of the multiphase clocks of high frequencies at higher precision based on the phase difference signal PA and the inverted phase difference signal PB.

Further, since the integrated circuit 1B has the variable delay element 16 in the relay circuit 11B and the input port 30, by supplying the feedback control signal FC from the external measuring device 2, the phases of the multiphase clocks MP1 are adjusted and a result of the adjustment can be easily recognised.

The first and second circuit configurations of the signal generating unit 13 shown in FIGS. 4 and 7 can foe applied as the circuit configuration of the signal generating unit 13 (FIGS. 1 and 2) of the first exemplary embodiment.

Third Exemplary Embodiment

Figure 11:
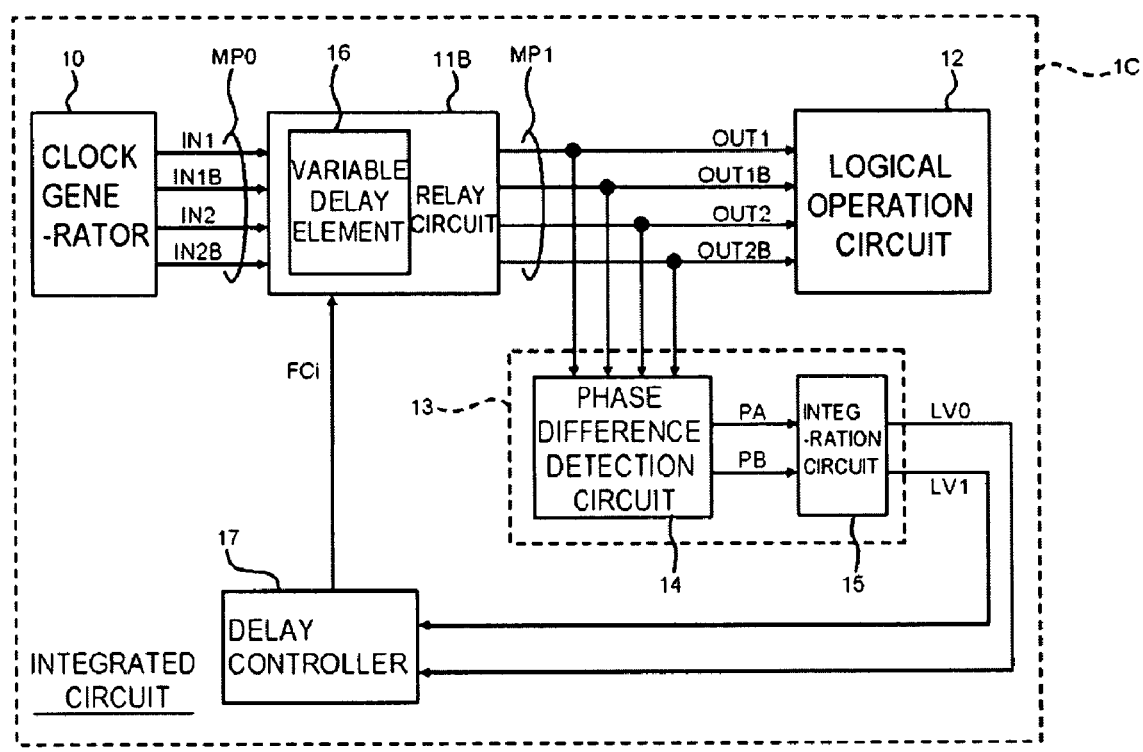
FIG. 11 is a block diagram showing a schematic configuration of an integrated circuit of a third exemplary embodiment of the invention.

A third exemplary embodiment of the present invention will now be described. FIG. 11 is a block diagram showing a schematic configuration of an integrated circuit 1C of the third exemplary embodiment of the invention. The integrated circuit 1C has the same configuration as that of the integrated circuit 1B of the second exemplary embodiment except for the point that a delay controller 17 is provided and the point that an output port for the analog voltage signals LV0 and LV1 is not provided.

The delay controller 17 functions as a feedback control system responding to the analog voltage signals LV0 and LV1. To be specific, the delay controller 17 generates the feedback control signal FCi for adjusting delay times on at least one of the input clock signals IN1, IN1B, IN2, and IN2B to decrease the phase error in the multiphase clocks MP0, and supplies the signal FCi to the variable delay element 16.

The integrated circuit 1C of the third exemplary embodiment can adjust the phases of the multiphase clocks MP0 with a relatively simple configuration.

Although the integrated circuit 1C of the third exemplary embodiment does not have an output port for outputting the analog voltage signals LV0 and LV1 to the outside, the invention is not limited to the configuration. In a manner similar to the second exemplary embodiment, the integrated circuit 1C may have an output part for outputting the analog voltage signals LV0 and LV1 to the outside.

Although the exemplary embodiments of the present invention have been described above with reference to the drawings, those are examples of the present invention, and various configurations other than the above can be also employed. For example, in the foregoing exemplary embodiments, the four-phase clocks are generated as the multiphase clocks. Instead, the clock generator 10 may generate multiphase clocks having their respective phases of multiples of 2, and the configurations of the exemplary embodiments may be properly changed so as to be adapted to the multiphase clocks.

It is understood that the foregoing description and accompanying drawings set forth the above exemplary embodiments of the invention at the present time. Various modifications, additions and alternatives will, of course, become apparent to those skilled in the art in light of the foregoing teachings without departing from the spirit and scope of the disclosed invention. Thus, it should be appreciated that the invention is not limited to the disclosed exemplary embodiments but may be practiced within the full scope of the appended claims.

What is claimed is:

1. A semiconductor integrated circuit comprising:
a logical operation circuit which operates synchronously with distributed multiphase clocks;
a clock generator which generates multiphase clocks of a plurality of clock signals having the same cycle and having respective different phases;
a relay circuit which distributes the generated multiphase clocks to said logical operation circuit;
a signal generating unit which detects phase states of the distributed multiphase clocks and generates an analog voltage signal having a voltage value indicative of a phase error in the distributed multiphase clocks on the basis of the detected phase states; and
an output port which outputs said analog voltage signal to the outside thereof,
wherein said logical operation circuit, said clock generator, said relay circuit, and said signal generating unit are integrated.

2. The semiconductor integrated circuit as set forth in claim 1, further comprising an input port to which a control signal is supplied by an external feedback control system responding to said analog voltage signal,
wherein said relay circuit includes a variable delay. element which adjusts phases of said multiphase clocks so as to reduce said phase error in accordance with the control signal.

3. The semiconductor integrated circuit as set forth in claim 2, wherein said variable delay element delays at least one of the clock signals of said multiphase clocks by a delay time specified by said control signal, thereby adjusting the phases of said multiphase clocks.

4. The semiconductor integrated circuit, as set forth in claim 2, wherein said relay circuit includes a buffer circuit which relays the multiphase clocks which are supplied from said clock generator.

5. The semiconductor integrated circuit as set forth in claim 4, wherein:
said relay circuit further includes a level converter which converts a voltage amplitude level adapted to a logic level, of the multiphase clocks output by said buffer circuit, into a voltage amplitude level adapted to a logic level being defined in said logical operation circuit;
said buffer circuit is a current mode logic circuit; and
said logical operation circuit is a CMOS logic circuit.

6. The semiconductor integrated circuit as set forth in claim 1, wherein said signal generating unit includes:
a phase difference detection circuit which detects a phase difference between clock signals of said multiphase clocks and generates a phase difference signal having a pulse width corresponding to the detected phase difference; and an integration circuit which integrates said phase difference signal to generate, as said analog voltage signal, a signal having a voltage value corresponding to said phase difference.

7. The semiconductor integrated circuit as set or in claim 6, wherein said integration circuit includes a first RC filter circuit which operates in response to said phase difference signal.

8. The semiconductor integrated circuit as set forth in claim 7, wherein said first RC filter circuit includes:
a first switching transistor which performs switching operation in response to said phase difference signal; and
a first capacitor including an end connected to both said first switching transistor and a voltage output terminal,
wherein said first switching transistor in a turned ON state connects the end of said first capacitor to a power source voltage terminal.

9. The semiconductor integrated circuit as set forth in claim 7, wherein:
said first RC filter circuit further includes a second switching transistor which performs switching operation in response to an inverted phase difference signal having a logic level obtained by inverting the logic level of said phase difference signal; and
said second switching transistor in a turned ON state connects the end of said first capacitor to a ground voltage terminal.

10. The semiconductor integrated circuit as set forth in claim 7, wherein said integration circuit includes a second RC filter circuit which operates in response to an inverted phase difference signal having a logic level obtained by inverting the logic level of said phase difference signal.

11. The semiconductor integrated circuit as set forth in claim 10, wherein said second RC filter circuit includes:
a third switching transistor which performs switching operation in response to said inverted phase difference signal; and
a second capacitor having an end connected to both said third switching transistor and a voltage output terminal,
wherein said third switching transistor in a turned ON state connects the end of said second capacitor to a power source voltage terminal.

12. The semiconductor integrated circuit as set forth in claim 10, wherein:
said second RC filter circuit further includes a fourth switching transistor which performs switching operation in response to said phase difference signal; and
said fourth switching transistor in a turned ON state connects the end of said second capacitor to a ground voltage terminal.

13. A semiconductor integrated circuit comprising:
a logical operation circuit which operates synchronously with distributed multiphase clocks;
a clock generator which generates multiphase clocks of a plurality of clock signals having the same cycle and having respective different phases;
a relay circuit which distributes the generated multiphase clocks to said logical operation circuit and adjusts phases of said multiphase clocks in accordance with a control signal being supplied by an outside source;
a signal generating unit which detects phase states of the distributed multiphase clocks and generates an analog voltage signal having a voltage value indicative of a phase error in the distributed multiphase clocks on the basis of the detected phase states; and
a delay control unit which generates said control signal so as to reduce said phase error in response to said analog voltage signal,
wherein said logical operation circuit, said clock generator, said relay circuit, said signal generating unit, and said delay control unit are integrated.

14. A semiconductor integrated circuit comprising:
means for operating synchronously with distributed multiphase clocks;
means for generating multiphase clocks of a plurality of clock signals having the same cycle and having respective different phases;
means for distributing the generated multiphase clocks to said means for operating synchronously;
means for detecting phase states of the distributed multiphase clocks and generates an analog voltage signal having a voltage value indicative of a phase error in the distributed multiphase clocks on the basis of the detected phase states; and
means for outputting said analog voltage signal to the outside thereof,
wherein said means for operating synchronously, said means for generating multiphase clocks, said means for distributing the generated multiphase clocks, and said means for detecting phase states are integrated.

15. A semiconductor integrated circuit comprising:
means for operating synchronously with distributed multiphase clocks;
means for generating multiphase clocks of a plurality of clock signals having the same cycle and having respective different phases;
means for distributing the generated multiphase clocks to said means for operating synchronously and adjusts phases of said multiphase clocks in accordance with a control signal being supplied by an outside source;
means for detecting phase states of the distributed multiphase clocks and generates an analog voltage signal having a voltage value indicative of a phase error in the distributed multiphase clocks on the basis of the detected phase states; and
means for generating said control signal so as to reduce said phase error in response to said analog voltage signal,
wherein said means for operating synchronously, said means for generating multiphase clocks, said means for distributing the generated multiphase clocks, said means for detecting phase states, and means for generating said control signal are integrated.

* * * * *